(12) United States Patent
Ito et al.

(10) Patent No.: US 7,696,849 B2
(45) Date of Patent: Apr. 13, 2010

(54) ELECTRONIC COMPONENT

(75) Inventors: Tomokazu Ito, Tokyo (JP); Takashi Kudo, Tokyo (JP); Makoto Otomo, Tokyo (JP)

(73) Assignee: TDK Corporation, Tokyo (JP)

( * ) Notice: Subject to any disclaimer, the term of this patent is extended or adjusted under 35 U.S.C. 154(b) by 1484 days.

(21) Appl. No.: 11/038,540

(22) Filed: Jan. 21, 2005

(65) Prior Publication Data

US 2005/0181684 A1    Aug. 18, 2005

(30) Foreign Application Priority Data

Jan. 30, 2004   (JP)   ............... 2004-023365

(51) Int. Cl.
  *H01F 27/29*   (2006.01)
(52) U.S. Cl. .................................. 336/192
(58) Field of Classification Search ................. 336/200, 336/223, 232, 83, 192, 206–208, 225
See application file for complete search history.

(56) References Cited

U.S. PATENT DOCUMENTS

| 6,618,929 | B2* | 9/2003 | Kitamura | .............. | 29/602.1 |
| 6,696,911 | B2* | 2/2004 | Tomohiro et al. | ........... | 336/200 |
| 6,710,694 | B2* | 3/2004 | Matsuta et al. | .............. | 336/200 |
| 2001/0026017 | A1* | 10/2001 | Seto | ........................... | 257/736 |
| 2002/0140539 | A1* | 10/2002 | Takashima et al. | .......... | 336/200 |

FOREIGN PATENT DOCUMENTS

| JP | 08-203737 A |   | 8/1996 |
| JP | 09153406 A | * | 6/1997 |
| JP | A-11-103229 |   | 4/1999 |

* cited by examiner

*Primary Examiner*—Tuyen Nguyen
(74) *Attorney, Agent, or Firm*—Oliff & Berridge, PLC

(57) ABSTRACT

An electronic component of the surface-mounted type having a mounting surface that can be mounted on the printed circuit board, maintaining sufficient insulation among the external electrodes despite the chip size is decreased, and having a large mounting strength. In a common mode choke coil array, for example, an external electrode is constituted by electrode pads formed on the mounting surfaces of insulating substrates mounted on a PCB, and a connection electrode which electrically connects an internal electrode terminal exposed on the outer surface different from the mounting surface to the electrode pads. The connection electrodes near the internal electrode terminals have a width c' smaller than a width b of the electrode pads as measured in the same direction.

8 Claims, 6 Drawing Sheets

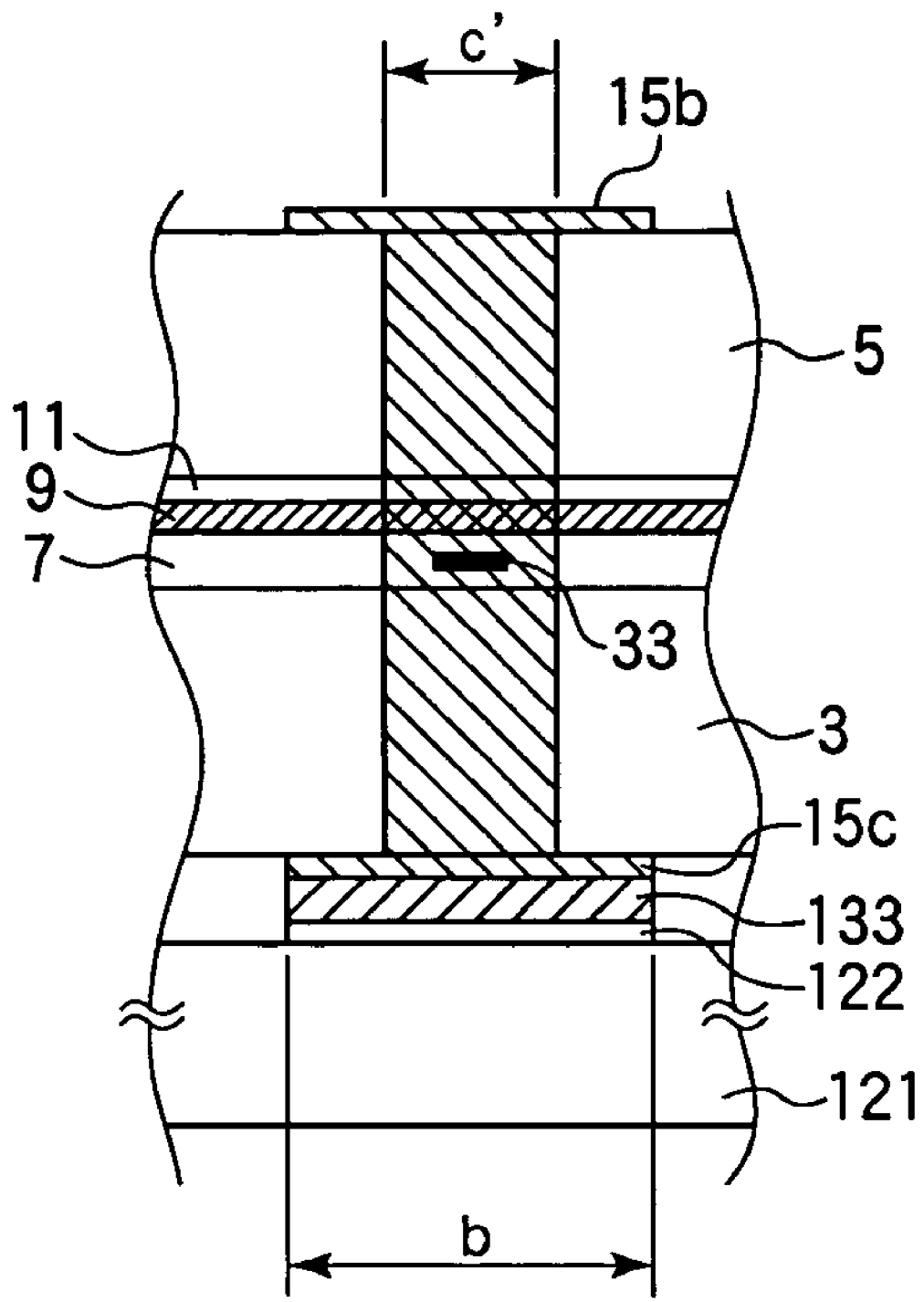

ELECTRONIC COMPONENT

BACKGROUND OF THE INVENTION

1. Field of the Invention

This invention relates to a surface-mounted type electronic component having a mounting surface to be mounted on a printed circuit board or a hybrid IC (HIC).

2. Description of the Related Art

Coil components mounted on internal circuitry of electronic equipment such as personal computers and cell phones include those of the winding type having two copper wires wound on a ferrite core, those of the laminated type obtained by forming a coil conductor pattern on the surface of a magnetic sheet such as of ferrite and laminating the magnetic sheets, and those of the thin film type obtained by alternately forming an insulating film and a coil conductor of a thin metal film relying on a thin film-forming technology.

JP-A-8-203737 discloses a common-mode choke coil that is used as a thin film type coil component. FIGS. 7A to 7C illustrate a state where a common mode choke coil array 101 formed by integrating two common mode choke coils is mounted on a printed circuit board (PCB) 121. 7A is a perspective view illustrating the appearance of the common mode choke coil array 101, FIG. 7B is a view illustrating, on an enlarged scale, an external electrode 114 connected to an internal electrode terminal 125 exposed to the side surface of the common mode choke coil array 101, and FIG. 7C is a view illustrating, on an enlarged scale, a state where an external electrode 114 shown in FIG. 7B is formed having a small width.

Referring to FIG. 7A, the common mode choke coil array 101 has a structure in which an insulating layer 107, a coil layer that is not shown, a magnetic layer 109 and an adhesive layer 111 are successively formed by the thin film-forming technology between the magnetic substrates 103 and 105 that are arranged facing each other. The internal electrode terminals 123, 125, 127 and 129 exposed to the insulating layer 107 are connected to the external electrodes 113, 114, 117 and 118. The internal electrode terminals (not shown) formed on the side surface facing the side surface on which the external electrodes 113, etc. are formed, are connected to the external electrodes 115, 116, 119 and 120, respectively.

Referring to FIGS. 7A and 7B, the external electrode 114 has rectangular electrode pads 114b and 114c formed, in an opposing manner, on the peripheral ends on the mounting surfaces of the magnetic substrates 103 and 105, and a connection electrode 114a formed on the outer surface on where the internal electrode terminal 125 is exposed. The connection electrode 114a electrically connects the internal electrode terminal 125 to the electrode pads 114b and 114c.

The external electrodes 113, 117 and 118, too, have rectangular mounting pads 113b, 117b and 118b formed on the peripheral ends on the mounting surface of the magnetic substrate 105, rectangular electrode pads (not shown) formed on the peripheral ends on the mounting surface of the magnetic substrate 103 being opposed to the mounting pads 113b, 117b and 118b, and connection electrodes 113a, 117a and 118a formed on the outer surface on where the internal electrode terminals 123, 127 and 129 are exposed. The connection electrodes 113a, 117a and 118a are electrically connecting together the internal electrode terminals 123, 127 and 129, the electrode pads 113b, 117b and 118b, and the electrode pads formed on the mounting surface of the magnetic substrate 103.

Similarly, further, the external electrodes 115, 116, 119 and 120 have electrode pads 115b, 116b, 119b and 120b formed on the mounting surface of the magnetic substrate 105 on the side of the opposing outer surface, electrode pads (not shown) formed on the mounting surface of the magnetic substrate 103, and connection electrodes (not shown) formed on the opposing outer surface.

Here, the trend toward fabricating electronic equipment such as personal computers and cell phones in ever small sizes is requiring a decrease in the size and thickness (height) of electronic component s or chips such as coils. The coils of the winding type are accompanied by a problem of difficulty in decreasing the size due to the limitation on the structure. On the other hand, the coils of the laminated type and the common mode choke coil array 101 of the thin film type can be fabricated in small sizes having decreased heights owing to their structures.

To decrease the size of the common mode choke coil array 101, it is necessary to shorten the length L of the coil array 101 shown in FIG. 7A. To shorten the length L, the widths of regions forming the external electrodes 113 to 120 (gap a among electrodes +width c of electrodes) may be shortened. It can, therefore, be contrived to shorten the gap a among the neighboring external electrodes 113 to 120 without varying the width c of the external electrodes 113 to 120. Here, though the magnetic substrates 103 and 105 have a sufficiently high resistivity, the magnetic layer 109 have a relatively low resistivity. Therefore, the resistivity among the neighboring external electrodes 113 to 120 decreases with a decrease in the gap a among the neighboring external electrodes 113 to 120. If the gap a is very shortened, therefore, it is probable that a current flows among the neighboring electrodes via the magnetic layer 109, lowering the electrical reliability of the common mode choke coil array 101. Therefore, shortening the length L imposes limitation on decreasing the gap a among the external electrodes 113 to 120.

Referring, next, to FIG. 7C, therefore, it can be contrived to shorten the width of the external electrodes 113 to 120 from c to c' (c'<c) while suppressing the gap a among the electrodes to be a required minimum value. First, by giving attention to the electrode pads 114b and 114c, the electrode pads 114b and 114c are formed by the electrode material that turns onto the mounting surfaces at the time of forming the connection electrode 114a. Therefore, a maximum pad width b of the electrode pads 114b and 114c becomes nearly equal to the width of the connection electrode 114a. If the electrode width of the connection electrode 114a is set to be c', therefore, the pad width b of the electrode pads 114b and 114c is shortened. Accordingly, the area decreases on where the electrode pad 114c comes into contact with a solder land pattern 122 on the PCB 121. The coil array 101 is electrically and mechanically connected to the PCB 121 by a solder 133 formed on the solder land pattern 122. If the contact area of the electrode pad 114c to the solder land pattern 122 decreases, therefore, the mounting strength of the coil array 101 decreases. The same also holds for the electrode pads 113b and 113c other than the electrode pad 114c. Thus, the reliability for mounting the coil array 101 decreases with a decrease in the width of electrodes such as the connection electrodes 114a, etc. In shortening the length L, therefore, limitation is imposed on decreasing the electrode width c of the external electrodes 113 to 120.

SUMMARY OF THE INVENTION

It is, therefore, an object of the present invention to provide an electronic component having a large mounting strength maintaining a sufficient degree of insulation among the external electrodes despite the size of the chip is decreased.

The above object is achieved by an electronic component comprising:

an electrode pad formed on a mounting surface to be mounted on a printed circuit board; and a connection electrode for electrically connecting the electrode pad to an internal electrode terminal exposed on an outer surface different from the mounting surface, a width of the connection electrode near the internal electrode terminal being smaller than a width of the electrode pad as measured in the same direction.

The electronic component of the invention has a feature in that the connection electrodes has a rectangular shape.

The electronic component of the invention has a feature in that the connection electrode has a trapezoidal shape.

The electronic component of the invention has a feature in that the connection electrode has a nearly symmetrical shape with the internal electrode terminal as center.

The electronic component of the invention has a feature of comprising a plurality of sets of the electrode pad and the connection electrode.

The electronic component of the invention has a feature in that the width of the electrode is smaller than a gap between the neighboring connection electrodes.

The electronic component of the invention has a feature in that a gap between the connection electrodes connecting the vicinities of the neighboring internal electrode terminals is longer than a gap between the neighboring electrode pads.

The electronic component of the invention has a feature of comprising a magnetic layer the end surface of which is exposed on the outer surface and is disposed in the vicinity of the neighboring internal electrode terminals, a gap between the neighboring connection electrodes is formed so as to become a maximum near the end surface of the magnetic layer.

The electronic component of the invention has a feature in that a plurality of sets of the electrode pad and the connection electrode are further formed on the opposing side of the outer surface.

The electronic component of the invention has a feature of further comprising a coil conductor connected to the internal electrode terminal, and an external electrode having the electrode pad and the connection electrode.

The invention realizes an electronic component maintaining a sufficient degree of insulation among the external electrodes despite of decreasing the size of the chip, and having a large mounting strength.

BRIEF DESCRIPTION OF THE DRAWINGS

FIG. 2 is a view illustrating, on an enlarged scale, an external electrode 15 of when an outer surface on which the internal electrode terminals 31, 33, 39 and 41 of the common mode choke coil array 1 of the embodiment of the invention are exposed is viewed from the direction of normal;

DESCRIPTION OF THE PREFERRED EMBODIMENTS

Figure 1A:
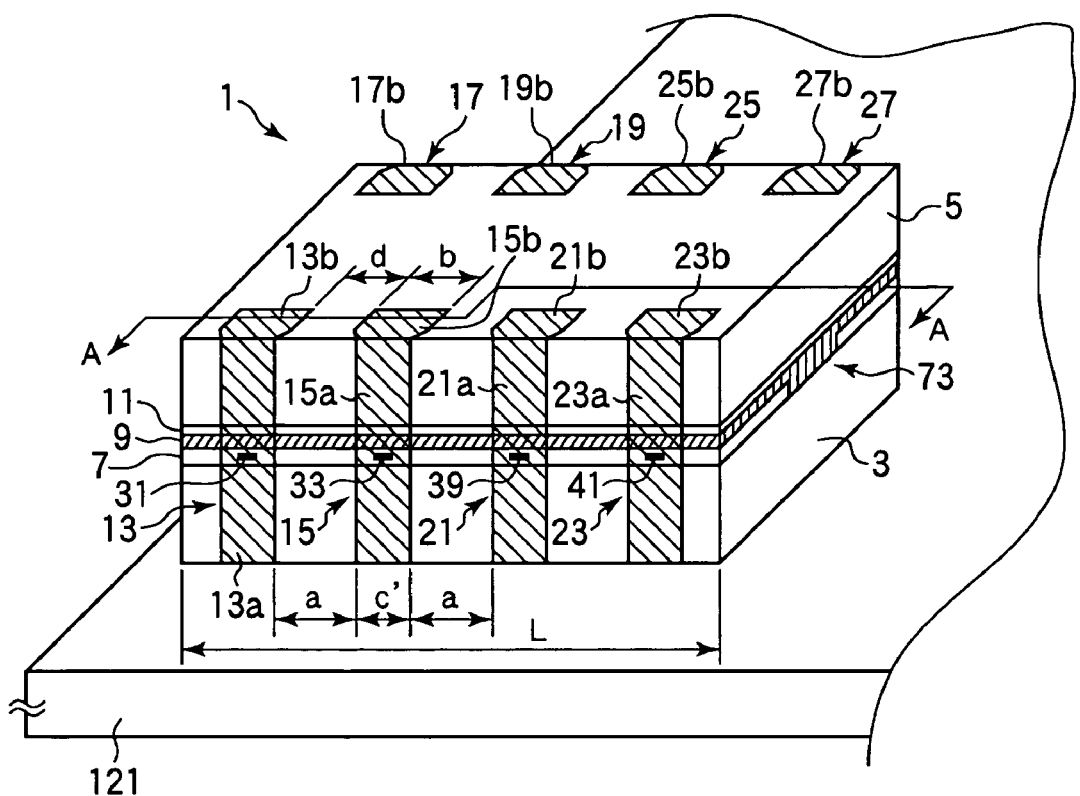
FIGS. 1A and 1B are a perspective view illustrating a state where a common mode choke coil array 1 according to an embodiment of the invention is mounted on a PCB 121, and a sectional view thereof.
Figure 1B:
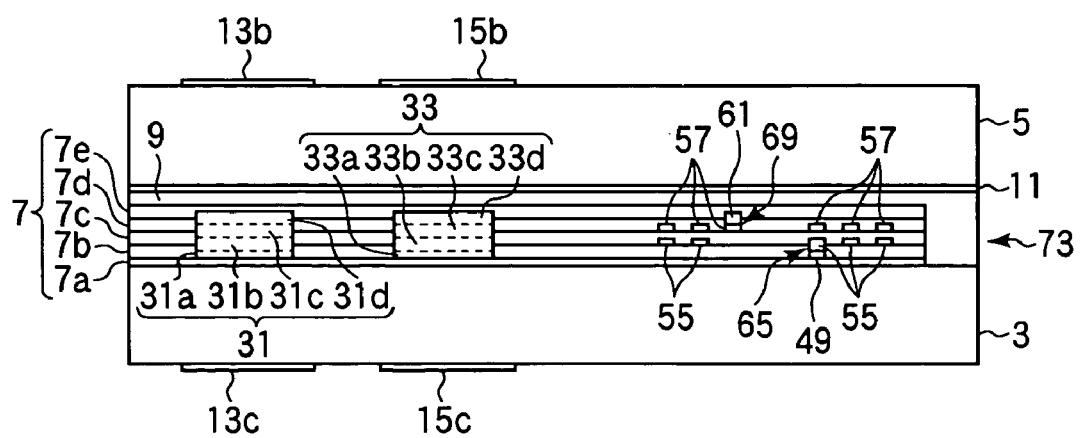

An electronic component according to an embodiment of the invention will now be described with reference to FIGS. 1A to 6. This embodiment deals, as an electronic component, with a common mode choke coil for suppressing the common mode current that becomes a cause of electromagnetic disturbance in the equilibrium transmission system. FIGS. 1A and 1B illustrate a state where a common mode choke coil array 1 integrating two common mode choke coils, is mounted on a printed circuit board (PCB) 121. FIG. 1A is a perspective view illustrating the appearance of the common mode choke coil array 1. For easy comprehension, FIG. 1A illustrates, in a perspective manner, the internal electrode terminals 31, 33, 39 and 41 which usually will not be viewed being covered with the external electrodes 13, 15, 21 and 23, and the shapes of the vicinities thereof. FIG. 1B is a sectional view cut along an imaginary line A-A in FIG. 1A.

Referring to FIG. 1A, the choke coil array 1 has a rectangular parallelepiped outer shape with thin layers laminated between the two insulating substrates 3 and 5 of the shape of thin rectangular parallelepiped plates arranged facing each other. Corner portions of the rectangular parallelepiped outer shape and the ends of the neighboring surfaces are chamfered though they are not shown.

The two opposing outer surfaces of the insulating substrates 3 and 5 are the mounting surfaces forming a plurality of electrode pads 13b, 17b, etc. for accomplishing electric and mechanical connection to the solder land patterns on the PCB 121. FIG. 1A illustrates a state where the mounting surface on the side of the insulating substrate 3 is mounted being faced to the surface of the PCB 121. It is, however, also allowable to mount the mounting surface on the side of the insulating substrate 5 being faced to the PCB 121. Cross sections of the laminate of thin films formed nearly in parallel with the mounting surface are exposed on four major outer surfaces connecting the two mounting surfaces. A plurality of internal electrode terminals 31, 33, etc. are exposed in the laminate of thin films exposed to the two side wall surfaces having a length L on the mounting surface among the four major outer surfaces. The internal electrode terminals 31, 33, 39 and 41 exposed on the side wall surface on this side of the drawing are arranged in line in a direction in parallel with the surface of the laminate of thin films maintaining nearly an equal distance. Even in the side wall surface (not shown) opposed to the, side wall surface of this side, in the drawing, there are arranged internal electrode terminals 35, 37, 43 and 45 (not shown) in line in a direction in parallel with the surface of the laminate of thin films maintaining nearly an equal distance.

The internal electrode terminals 31 to 45 are connected to the external electrodes 13 to 27 that come into electric contact covering the terminals on the side wall surfaces. The external electrode 13 is constituted by an electrode pad 13b formed on the mounting surface on the side of the insulating substrate 5, an electrode pad 13c (see FIG. 1B) formed on the mounting surface on the side of the insulating substrate 3, and a connection electrode 13a formed on the side wall surface to electrically connect together the pair of electrode pads 13b, 13c and the internal electrode terminal 31. Likewise, other external electrodes 15, 17 . . . 25 and 27 are constituted by electrode pads 15b, 15c . . . 27b and 27c formed on the two mounting surfaces, and connection electrodes 15a, 17a . . . 25a and 27a formed on the side wall surfaces to electrically connect together pairs of electrode pads 15b, 15c . . . 27b and 27c, and internal electrode terminals 33 . . . 45.

Referring to FIG. 1B, the laminate of thin films formed between the insulating substrates 3 and 5 includes an insulating film 7a, an electrically conducting lead wire 49, an insulating film 7b, an electrically conducting coil conductor 55, an insulating film 7c, an electrically conducting coil conductor 57, an insulating film 7d, an electrically conducting lead wire 61 and an insulating film 7e, which are laminated in this order. The coil conductor 55 and the coil conductor 57 are formed in a spiral shape and are facing each other via the insulating film 7c. The coil conductor 55 is connected to a lead wire 49 via a through-hole 65 formed in the insulating film 7b. The coil conductor 57 is connected to a lead wire 61 via a through-hole 69 formed in the insulating film 7d. The coil conductors 55 and 57 and the lead wires 49, 61 are buried in an insulating layer 7 comprising the insulating films 7a to 7e to constitute a choke coil.

The lead wires 49 and 61 are connected to the internal electrode terminals 41 and 39, respectively, in the insulating layer 7. Therefore, the coil conductors 55 and 57 are connected to the external electrodes 23 and 21 that come in contact covering the internal electrode terminals 41 and 39. Further, the coil conductors 55 and 57 are connected to the two internal electrode terminals (not shown) exposed on the wall surface of the other side opposed to the wall surface of the one side, and are connected to the external electrodes 27 and 25 formed on the exposed portion. Therefore, the external electrode 23 is electrically connected to the external electrode 27 via the lead wire 49 and the coil conductor 55, and the external electrode 21 is electrically connected to the external electrode 25 via the lead wire 61 and the coil conductor 57.

In the insulating layer 7, further, there is buried a choke coil (not shown) constituted in the same manner as the choke coil constituted by the coil conductor 55, etc. on the left side in the drawing. A lead wire (not shown) formed on the insulating film 7a is connected to the internal electrode terminal 31, and a lead wire (not shown) formed on the insulating film 7d is connected to the internal electrode terminal 33. The lead wires are connected to the coil conductors (not shown) that are facing each other via the insulating film 7c. Therefore, the coil conductors are connected to the external electrodes 13 and 15 formed on the exposed portions of the internal electrode terminals 31 and 33. The coil conductors are further connected to the two internal electrode terminals (not shown) exposed on the wall surface of the opposing side. The external electrodes 17 and 19 are formed on the exposed portions of the two internal electrode terminals, and the external electrodes 13 and 15 are respectively electrically connected to the external electrodes 17 and 19 through the lead wire and the coil conductor.

As will be described later in detail, the internal electrode terminals 31 and 33 are formed by laminating copper (Cu) layers 31a to 31d and 33a to 33d. The internal electrode terminals 39 and 41 and other internal electrode terminals that are not shown, too, are formed by laminating Cu layers.

An opening 73 is formed in the outer peripheral side of the coil conductors 55 and 57 and in a peripheral end portion of the insulating substrate 3 by removing the insulating layer 7, so that the insulating substrate 3 is exposed. A magnetic layer 9 is formed on the insulating layer 7 burying the opening 73. Further, an adhesive layer 11 is formed on the magnetic layer 9, and the insulating substrate 5 is secured thereon.

The insulating substrates 3 and 5 are made of a sintered ferrite, a composite ferrite or the like. The insulating films 7a to 7e are formed by applying a material having excellent insulation and workability, such as a polyimide resin or an epoxy resin, followed by patterning into a predetermined shape. The coil conductors 55 and 57, lead wires 49 and 61, and internal electrode terminals 31, 33, 39 and 41 are formed by forming films of Cu, silver (Ag) or aluminum (Al) having excellent electric conduction and workability, followed by patterning into a predetermined shape. The magnetic layer 9 is formed by using a composite ferrite comprising an epoxy resin or a polyimide resin containing a magnetic material powder such as ferrite.

By flowing a current through the coil conductors 55 and 57, there is formed a magnetic passage in order of the insulating substrate 3, insulating layer 7 at the central portions of the coil conductors 55 and 57, magnetic layer 9 on the insulating layer 7, adhesive layer 11, insulating substrate 5, adhesive layer 11 and magnetic layer 9 in the opening 73 on the cross section including the center axes of the coil conductors 55 and 57. The insulating layer 7 and the adhesive layer 11 are non-magnetic. Therefore, this magnetic passage is an open passage. Namely, the insulating substrates 3 and 5 and the magnetic layer 11 are not easily magnetically saturated, and the common mode choke coil array 1 exhibits little dispersion in the inductance thereof.

Figure 7A:
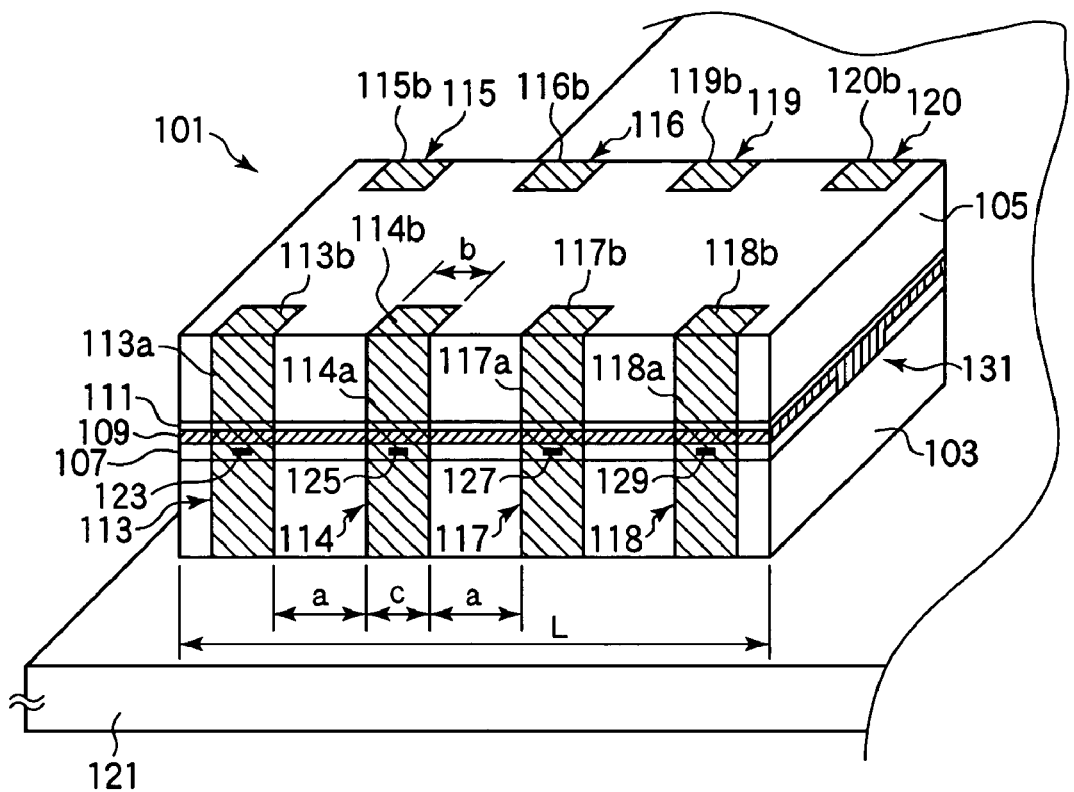
FIGS. 7A to 7C are a perspective view illustrating a state where a conventional common mode choke coil array 101 is mounted on a PCB 121.
Figure 7B:
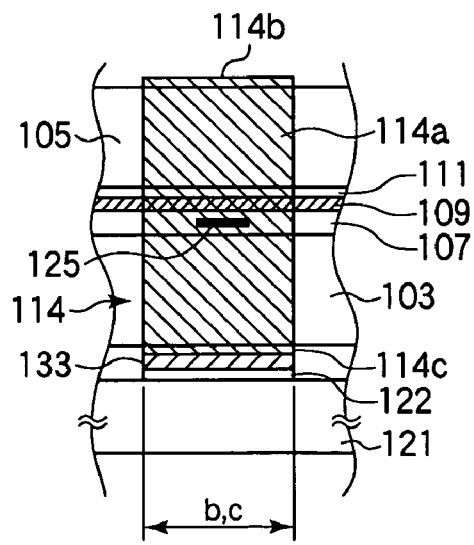
Figure 7C:
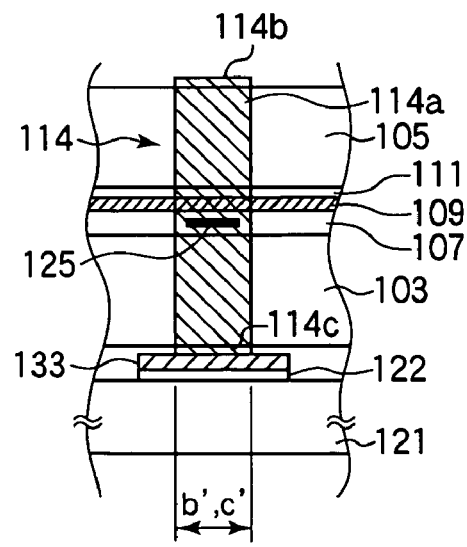

Reverting to FIG. 1A, the connection electrode 13a has a width c' as measured in a direction in parallel with the surface of the laminate of thin films near the internal electrode terminal 31. Similarly, the connection electrodes 15a to 27a have a width c' near the internal electrode terminals 33 to 45 as measured in the same direction as above. Further, the gaps are set to be a among the connection electrodes arranged neighboring each other on the wall surface of the same side. Here, the electrode width c' is equal to the electrode width c' shown in, for example, FIG. 7C, but is narrower than the electrode width c shown in FIG. 7B. Further, the gap a among the connection electrodes has a minimum required length that does not at least deteriorate electric reliability of the common mode choke coil array 1 like the gap a shown in FIG. 7A and does not cause erroneous mounting even in case the chip is mounted in a deviated manner.

The electrode width c' is smaller than the gap a. The connection electrodes 13a to 27a in this embodiment have a rectangular shape and are symmetrically formed on both mounting surfaces with the internal electrode terminals 31 . . . 45 as nearly centers. Therefore, the electrode width is c' even as measured in a direction that intersects the two mounting surfaces.

The electrode pads 13b, 13c . . . 27b and 27c formed on both mounting surfaces are electrically connected to the connection electrodes 13a . . . 27a at intersecting portions of the mounting surface and the side wall surface. The electrode pads 13b, 13c . . . 27b and 27c are formed in, for example, a hexagonal shape having two sides nearly in parallel with the line intersecting the mounting surface and the side wall surface. The pad width measured at the portion of the intersecting line in the direction of the intersecting line is equal to, for example, the electrode width c', and a maximum pad width measured in the direction of the intersecting line is nearly equal to the width b (b>c') of the conventional electrode pad 114b shown in, for example, FIGS. 7A and 7B. Therefore, the electrode pads 13b to 27c of the embodiment maintain contact areas to the solder land pattern 122 of PCB 121 nearly equal to those of the conventional electrode pads 114b, etc. shown in FIG. 7B.

The connection electrodes 13a to 27a have a width c' smaller than a maximum pad width b of the electrode pads 13b, 13c . . . 27b and 27c measured in the same direction. Further, the gap d among the neighboring electrode pads are larger than the gap a among the neighboring connection electrodes.

FIG. 2 is a view illustrating, on an enlarge scale, the external electrode 15 of when one side wall surface is viewed from the direction of the normal. As shown in FIG. 2, even when the width of the connection electrodes 13a to 23a is decreased to decrease the size of the common mode choke coil array 1, the pad width b of the electrode pads 15b, 15c or the like is nearly the same as the pad width b of the electrode pads 114b, 114c or the like of the conventional common mode choke coil array 101. Therefore, the common mode choke coil array 1 maintains sufficient contact areas between the electrode pads 15c, etc. with the solder land pattern 122 formed on the PCB 121. Therefore, the common mode choke coil array 1 maintains a sufficiently large mounting strength when it is mounted on the PCB 121 by using the solder 133. Thus, despite the chip is fabricated in a small size, the common mode choke coil array 1 maintains a sufficiently large insulation resistance among the neighboring external electrodes 13 to 27 and a sufficiently large mounting strength when mounted, improving reliability.

In the common mode choke coil array 1 of this embodiment as described above, the electrode width c' near the internal electrode terminal is selected to be smaller than the conventional electrode width c, the gap a is decreased to a minimum required limit that does not lower the electrical reliability and that does not cause erroneous mounting even in case the chip is mounted being deviated. This makes it possible to increase the length of the magnetic layer 9 among the neighboring connection electrodes connecting the vicinities of the neighboring internal electrode terminals exposed on the side wall surface to a degree to exhibit a sufficiently large resistance and to maintain sufficiently large contact areas to the solder land pattern 122 of the PCB 121.

More concretely speaking, the length of the sum of the electrode width c' and the gap a among the electrodes of the common mode choke coil array 1 can be shortened by $\Delta c$ (=(electrode width c+gap a among the electrodes)−(electrode width c'+gap a among the electrodes)) as compared to the corresponding length of the conventional counterparts. According to the common mode choke coil array 1 of this embodiment, therefore, the length L of the common mode choke coil array 1 can be shortened by the number of gaps $\Delta c$ (three times of $\Delta c$ in this embodiment) as compared to that of the related art yet maintaining a sufficiently large insulating resistance among the neighboring connection electrodes. According to this embodiment, therefore, a sufficiently large insulation is maintained among the external electrodes despite the size of the chip is decreased, and a common mode choke coil array 1 having a large mounting strength is realized.

Figure 3:
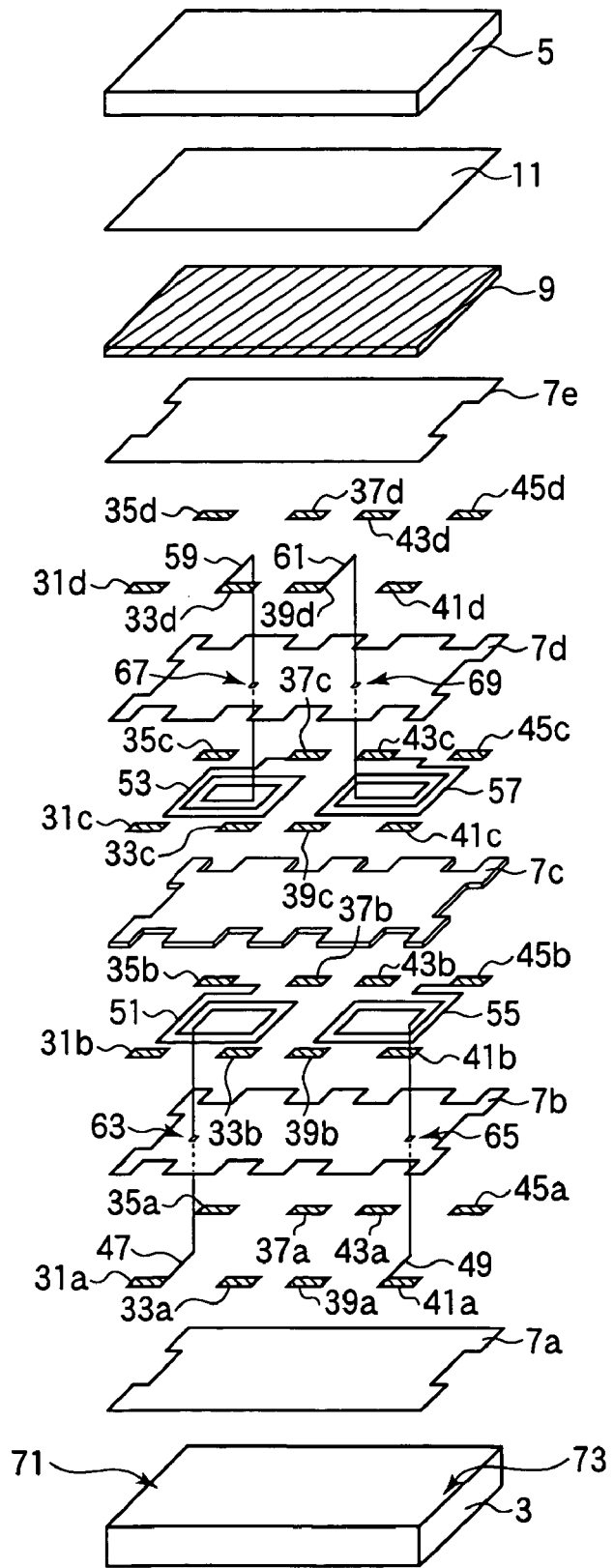
FIG. 3 is a perspective view showing, in a disassembled manner, a common mode choke coil array 1 for illustrating a method of fabricating a common mode choke coil array 1 according to an embodiment of the invention.

Next, a method of producing an electronic component according to the embodiment will be described with reference to FIGS. 3 and 4. Described below is a common mode choke coil array 1 integrating two common mode choke coils. The common mode choke coil arrays 1 are simultaneously formed in a plural number on a wafer. FIG. 3 is a disassembled perspective view of the individual chips which, in practice, have not been cut and separated in the wafer. Constituent elements exhibiting the same actions and functions as the constituent elements of the common mode choke coil array 1 shown in FIGS. 1A and 1B are denoted by the same reference numerals but their description is not repeated.

Referring, first, to FIG. 3, a polyimide resin is applied onto the insulating substrate 3 and is patterned to form an insulating film 7a having openings 71 and 73. The insulating film 7a is formed by a spin-coating method, a dipping method, a spray method, a printing method or the like. The insulating films that will be described later are formed by the same method as the insulating film 7a.

Next, a metal layer (not shown) such as of Cu is formed on the whole surface by a vacuum film-forming method (vacuum evaporation, sputtering, etc.) or a plating method, patterned by an etching method based on a photolithography or by an additive method (plating) thereby to form internal electrode terminals 31a to 45a positioned on the periphery of the insulating substrate 3. At the same time, there are formed a lead wire 47 connected to the internal electrode terminal 31a and a lead wire 49 connected to the internal electrode terminal 41a. The metal layers that will be described later are formed and patterned in the same manner as those for the internal electrode terminals 31a to 45a.

Next, a polyimide resin is applied onto the whole surface and is patterned to form an insulating film 7b having openings exposing the ends of the lead wires 47 and 49 that are not connected to the internal electrode terminals 31a to 45a or to the internal electrode terminals 31a and 41a, and exposing the openings 71 and 73. Thus, there are formed through-holes 63 and 65 exposing the ends of the lead wires 47 and 49.

Next, a metal layer (not shown) such as Cu layer is formed on the whole surface, the coil conductors 51 and 55 patterned in a spiral shape are formed on the insulating film 7b and, at the same time, the internal electrode terminals 31b to 45b are formed on the internal electrode terminals 31a to 45a. The one terminal of the coil conductor 51 is formed on the lead wire 47 exposed in the through hole 63, and the other terminal thereof is formed being connected to the internal electrode terminal 35b. Further, the one terminal of the coil conductor 55 is formed on the lead wire 49 exposed in the through hole 65, and the other terminal thereof is connected to the internal electrode terminal 45b. Through the coil conductor 51 and the lead wire 47, therefore, the internal electrode terminals 31a and 31b and the internal electrode terminals 35a and 35b are electrically connected together. Similarly, the internal electrode terminals 41a, 41b and the internal electrode terminals 45a, 45b are electrically connected together through the coil conductor 55 and the lead wire 49.

Next, the polyimide resin is applied onto the whole surface and is patterned to form the insulating film 7c having openings for exposing the internal electrode terminals 31b to 45b and for exposing the openings 71 and 73.

Next, a metal layer (not shown) such as Cu layer is formed on the whole surface, the coil conductors 53 and 57 patterned in a spiral shape are formed on the insulating film 7c and, at the same time, the internal electrode terminals 31c to 45c are formed on the internal electrode terminals 31b to 45b. The one terminal of the coil conductor 53 is formed being connected to the internal electrode terminal 37c. Further, the one terminal of the coil conductor 57 is formed being connected to the internal electrode terminal 43c.

Next, the polyimide resin is applied onto the whole surface and is patterned to form the insulating film 7d having openings for exposing the internal electrode terminals 31c to 45c, other terminals of the coil conductors 53 and 57, and for exposing the openings 71 and 73. Thus, there are formed through-holes 67 and 69 exposing the other terminals of the coil conductors 53 and 57.

Next, a metal layer (not shown) such as Cu layer is formed on the whole surface, and is patterned to form the internal electrode terminals 31d to 45d on the internal electrode terminals 31c to 45c. At the same time, a lead wire 59 is formed for connecting the internal electrode terminal 33d to the other terminal of the coil conductor 53 exposed in the through-hole 67. At the same time, further, a lead wire 61 is formed for connecting the internal electrode terminal 39d to the other terminal of the coil conductor 57 exposed in the through-hole 69. Through the coil conductor 53 and the lead wire 59, therefore, the internal electrode terminals 33 (33a, 33b, 33c, 33d) and the internal electrode terminals 37 (37a, 37b, 37c, 37d) are electrically connected together. Similarly, the internal electrode terminals 39 (39a, 39b, 39c, 39d) and the internal electrode terminals 43 (43a, 43b, 43c, 43d) are electrically connected together through the coil conductor 57 and the lead wire 61.

Next, the polyimide resin is applied onto the whole surface and is patterned to form the insulating film 7e having openings for exposing the openings 71 and 73. Next, a magnetic layer 9 is formed on the insulating film 7e by the printing method. Thus, the magnetic layer 9 fills the openings 71 and 73 to reach the surface of the insulating substrate 3. Next, an adhesive is applied onto the magnetic layer 9 to form an adhesive layer 11. The insulating substrate 5 is then secured to the adhesive layer 11.

Next, the wafer is cut into individual chip-like common mode choke coil arrays 1. The internal electrode terminals 31 to 45 are exposed on the cut surface of each common mode choke coil array 1. The common mode choke coil array 1 is polished to chamfer the corner portions. FIGS. 1A, 1B, 4 and 5 illustrate the common mode choke coil array 1 omitting the chamfered portions.

Figure 4:
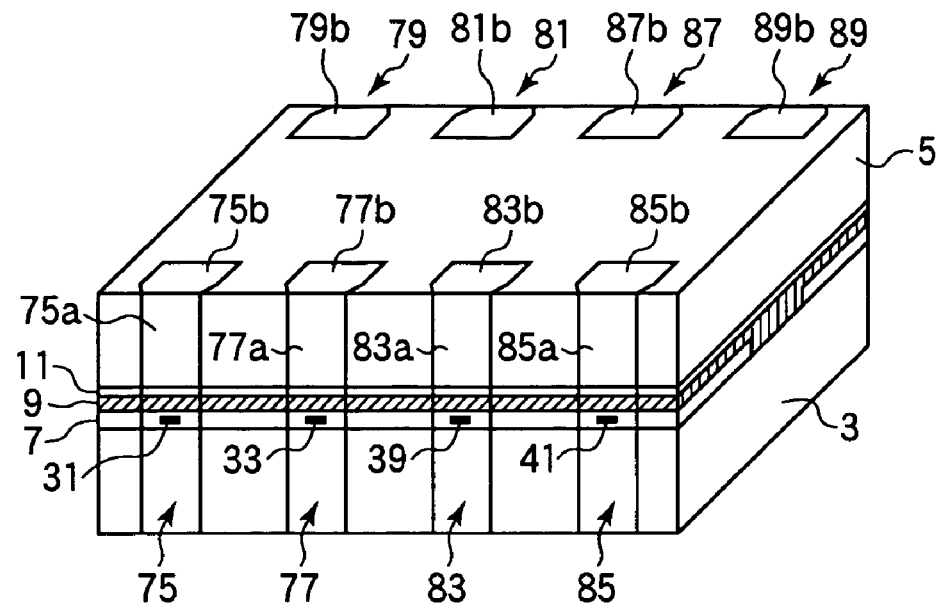
FIG. 4 is a perspective view of a common mode choke coil array 1 for illustrating the method of fabricating the common mode choke coil array 1 according to the embodiment of the invention.
Figure 5:
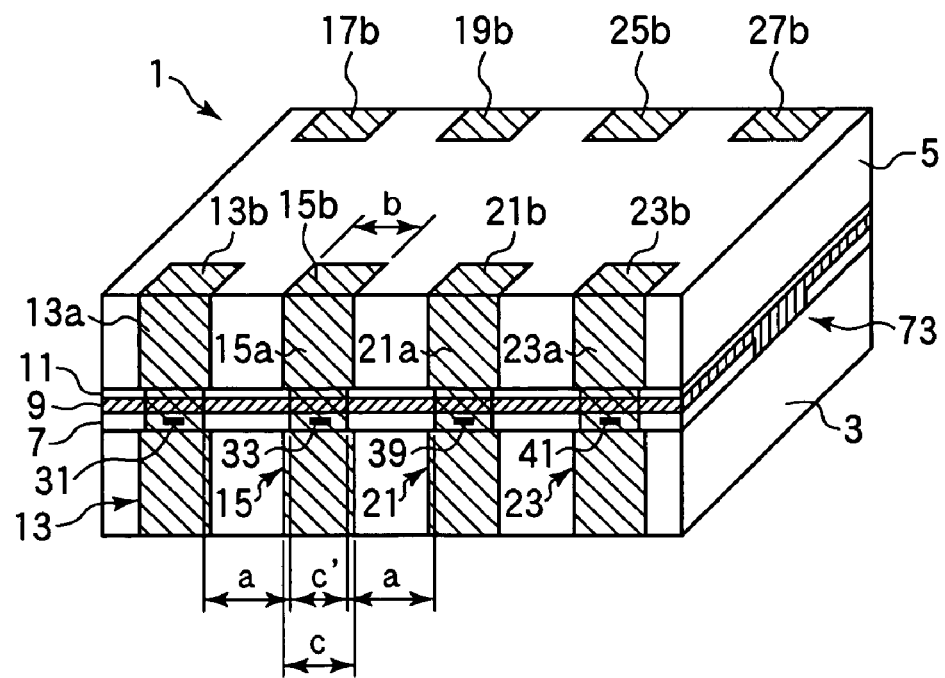
FIG. 5 is a perspective view of a modified example of the common mode choke coil array 1 according to the embodiment of the invention.

Referring, next, to FIG. 4, underlying metal films 75 to 89 of the same shape as the external electrodes 13 to 27 are formed on the internal electrode terminals 31 to 45 of the common mode choke coil array 1. The underlying metal films 75 to 89 are formed by the mask-sputtering method. First, in a step of transferring the chips, a plurality of chip-like common mode choke coil arrays 1 are inserted in a chip-fastening jig (not shown) and, then, the common mode choke coil arrays 1 are positioned and secured by screws. Referring, next, to FIG. 5, a mask (not shown) patterning the shapes of the connection terminals 13a, 15a, 21a and 23a is set to a predetermined position from above the internal electrode terminals 31, 33, 39 and 41 and is secured.

Next, in a step of sputtering, an underlying metal film of a predetermined shape is formed on the common mode choke coil 1. First, the common mode choke coil array 1 onto which the mask is set in the step of transferring the chips, is set onto a sputtering apparatus (not shown) and, then, chromium (Cr)/Cu films are continuously formed from above the upper surface of the mask to form underlying metal films 75a, 77a, 83a and 85a shown in FIG. 4. Next, the common mode choke coil array 1 is reversed such that the internal electrode terminals 35, 37, 43 and 45 face the mask, and a Cr/Cu film is continuously formed from the upper surface of the mask so as to form an underlying metal film (not shown).

Another mask patterning the shapes of the electrode pads 13b to 27b shown in FIG. 5 is set and secured onto a predetermined position being faced to the mounting surface of the insulating substrate 5 of the common mode choke coil array 1. Next, the Cr/Cu film is continuously formed from the upper surface of the mask to form underlying metal films 75b to 89b shown in FIG. 4. Next, the common mode choke coil array 1 is reversed such that the mounting surface of the insulating substrate 3 faces the mask, and a Cr/Cu film is continuously formed from the upper surface of the mask so as to form an underlying metal film (not shown).

In a step of separating the chips, the common mode choke coil arrays 1 are removed from the chip-securing jig to end the formation of the underlying metal layers 75 to 89.

Next, a film of an alloy conductor material of tin (Sn), nickel (Ni) and Cu is formed on the surfaces of the underlying metal films 75 to 89 by barrel-plating to form external electrodes 13 to 27 of a two-layer structure of nickel and an electrically conducting alloy material to end the fabrication of the common mode choke coil array 1 shown in FIGS. 1A and 1B.

By forming the underlying metal films 75 to 89 by the mask-sputtering method, as described above, it is allowed to easily and precisely adjust the widths of connection electrodes 13a to 27a and the widths of electrode pads 13b to 27c.

According to the electronic component of this embodiment as described above, the widths of the connection electrodes 13a to 23a are decreased to increase the gap among the neighboring external electrodes 13 to 27 and to maintain a sufficiently large insulating resistance among the electrodes despite the common mode choke coil array 1 is realized in a small size. Further, the common mode choke coil array 1 has the electrode pads 13b to 27b of an increased width to maintain a sufficiently large mounting strength. This enhances the electrical and mounting reliability of the common mode choke coil array 1.

Next, a modified embodiment will be described with reference to FIG. 5 which is a perspective view of the common mode choke coil array 1 according to the modified embodiment. Referring to FIG. 5, the connection electrodes 13a, 15a, 21a and 23a of the common mode choke coil array 1 are so formed as to assume an electrode width c' near the magnetic layer 9. On the other hand, the connection electrodes 13a, 15a, 21a and 23a formed on the side surfaces of the insulating substrates 3 and 5 have a width c (c>c'). The connection electrodes 13a, 15a, 21a and 23a formed near the magnetic layer 9 and on the side surfaces of the insulating substrates 3 and 5 have a rectangular shape. The connection electrodes 13a, 15a, 21a and 23a have nearly a symmetrical pattern with the internal electrode terminals 31, 33, 39 and 41 as centers. The connection electrodes (not shown) formed on the surface facing the outer surface on where the connection terminals 13a, 15a, 21a and 23a are formed, too, have the same shape as the connection electrodes 13a, 15a, 21a and 23a.

In the common mode choke coil array 1 of this modified embodiment, the connection electrodes 13a, 15a, 21a and 23a have a small width c' near the magnetic layer 9 that has a relatively low resistivity. Therefore, despite the common mode choke coil array has the same chip size as the common mode choke coil array 1 of the above embodiment, the gap a is maintained among the neighboring connection electrodes that are connected through the magnetic layer 9. Even with the connection electrodes of this pattern, a sufficiently large insulation resistance is maintained among the neighboring external electrodes 13 to 27.

The connection electrodes 13a, 15a, 21a and 23a formed on the side surfaces of the insulating substrates 3 and 5 have the width c (c=b). Therefore, the underlying metal film of the electrode pads 13a, 15a, 21a and 23a and of the electrode pads (not shown) on the mounting surface of the insulating substrate 3, may be formed by using the material of the underlying metal film that turns onto the mounting surface at the time of sputtering the underlying metal film for forming the connection electrodes 13a, 15a, 21a and 23a. Thus, the electrode pads 13b to 27b of the common mode choke coil array 1 are formed in a rectangular shape having a width b to maintain a sufficiently large mounting strength. In this case, there is no need of separately forming by sputtering the underlying metal film for electrode pads on the mounting surface, and no mask is needed for forming the electrode pads. Further, the conventional steps of fabrication can be utilized without alteration.

According to the modified embodiment as described above, a sufficiently large insulation resistance is maintained among the neighboring external electrodes 13 to 27 despite the common mode choke coil array 1 is fabricated in a small size. Further, the common mode choke coil array 1 maintains a sufficiently large mounting strength exhibiting enhanced electrical and mounting reliability. Besides, the steps of fabrication are the same as those of the related art, suppressing the cost of production and lowering the cost of fabricating the common mode choke coil array 1.

Figure 6:
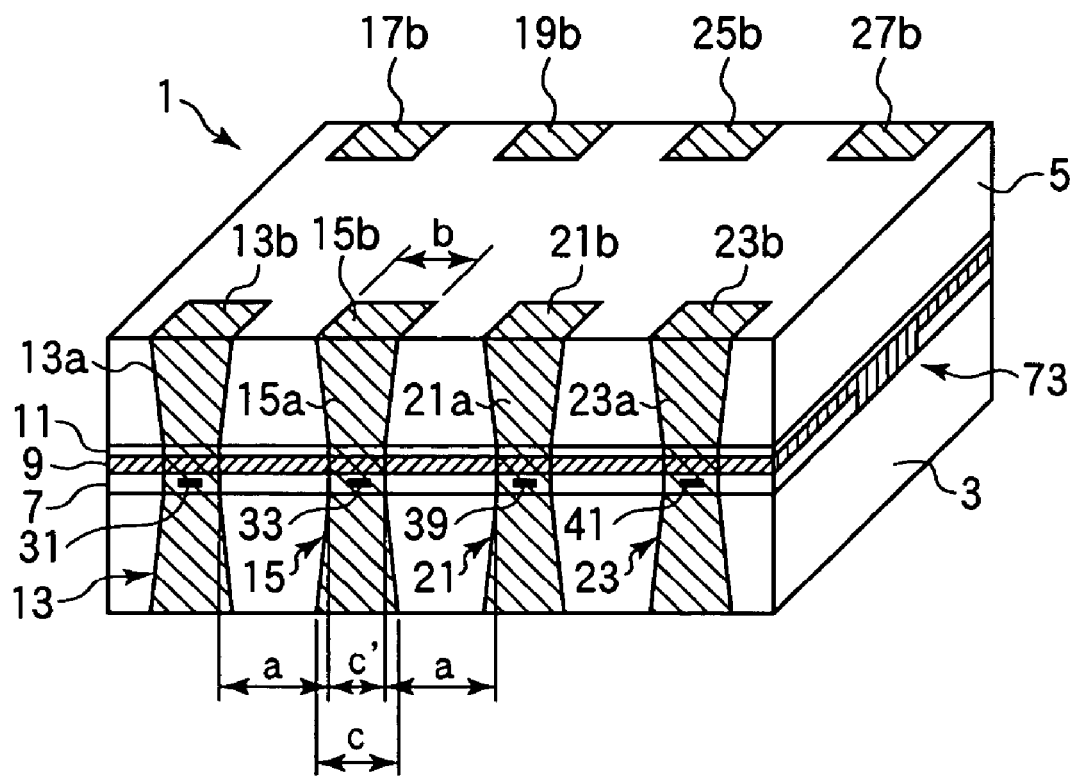
FIG. 6 is a perspective view of another modified example of the common mode choke coil array 1 according to the embodiment of the invention.

Next, described below with reference to FIG. 6 is a further modified embodiment. FIG. 6 is a perspective view of the common mode choke coil array 1 according to the modified embodiment. Referring to FIG. 6, the connection electrodes 13a, 15a, 21a and 23a of the common mode choke coil array 1 according to the modified embodiment have the minimum width c' near the magnetic layer 9. Further, the connection electrodes 13a, 15a, 21a and 23a have the maximum width c (c=b) near the mounting surface. The connection electrodes 13a, 15a, 21a and 23a formed on the side wall surface has a trapezoidal shape. The connection electrodes 13a, 15a, 21a and 23a have a nearly symmetrical shape with the internal electrode terminals 31, 33, 39 and 41 as centers.

In the common mode choke coil array 1 of this modified embodiment like that of the above modified embodiment, the connection electrodes 13a, 15a, 21a and 23a near the magnetic layer 9 of a relatively low resistivity have the minimum width c' enabling the neighboring connection electrodes coupled by the magnetic layer 9 to assume the gap a. Therefore, despite the chip size is decreased, the common mode choke coil array 1 maintains a sufficient insulation resistance among the external electrodes 13 to 27.

Further, since the connection electrodes 13a, 15a, 21a and 23a have the width c near the mounting surface, the underlying metal film of the electrode pads 13b, 15b, 21b and 23b are formed in a rectangular shape having the width b owing to the underlying metal film material that turns onto the mounting surface at the time of forming by sputtering the underlying metal film for the connection electrodes 13a, 15a, 21a and 23a. This does not require a mask for forming electrode pads, suppresses the cost of production, and decreases the number of steps for fabrication. This modified embodiment exhibits the same effect as that of the above modified embodiment.

This invention can be modified in a variety of ways not being limited to the above embodiments only.

Though the common mode choke coil array according to the embodiment was described above as an electronic component, the invention is in no way limited thereto only. For instance, the same effect is obtained even when the invention is applied to an electronic component of the surface-mounted type having two or more external electrodes on one outer surface.

In the above embodiment, the connection electrodes have a rectangular shape or a shape of a combination of a rectangular shape and a trapezoidal shape, though the invention is in no way limited thereto only. The connection electrodes may have any pattern provided it makes it possible to maximize the gap among the electrodes at a place of a relatively low resistivity like the magnetic layer 9. This makes it possible to maintain a sufficiently large insulation resistance among the electrodes.

Further, not being limited to the hexagonal shape or the rectangular shape, the electrode pads formed on the mounting surface may have a shape with a width that maintains a sufficient contact area with the solder land pattern 122 on the PCB 121. In this case, too, there is obtained the same effect as that of the above embodiments.

The electronic component (common mode choke coil array) according to the above embodiment has a rectangular parallelepiped outer shape, to which only, however, the invention is not limited. The outer surface other than the mounting surface may assume a variety of shapes such as cylindrical shape, square pole-like shape, conical shape, pyramidal shape, semicircular shape, elliptic shape, or a combination thereof.

What is claimed is:

1. An electronic component comprising:
   an electrode pad formed on a mounting surface; and
   a connection electrode for electrically connecting the electrode pad to an internal electrode terminal exposed on an outer surface different from the mounting surface, a width of the connection electrode near the internal electrode terminal being smaller than a width of the electrode pad and a width of the connection electrode near the mounting surface as measured in a same direction, wherein
   the connection electrode has a double trapezoidal shape in which an upper base of one of two trapezoids and a lower base of the other of the two trapezoids are connected near the internal electrode terminal,
   a length of the upper base of the one of the two trapezoids is shorter than a length of a lower base thereof, and
   a length of the lower base of the other of the two trapezoids is shorter than a length of an upper base thereof.

2. An electronic component according to claim 1, wherein the connection electrode has a nearly symmetrical shape with the internal electrode terminal as center.

3. An electronic component according to claim 1, further comprising a plurality of sets of electrode pads and connection electrodes.

4. An electronic component according to claim 3, wherein the width of the connection electrode is smaller than a gap between neighboring connection electrodes.

5. An electronic component according to claim 3, wherein a gap between portions of the connection electrodes containing the neighboring internal electrode terminals is longer than a gap between the neighboring electrode pads.

6. An electronic component according to claim 3, further comprising a magnetic layer having an end surface which is exposed on the outer surface and disposed near the neighboring internal electrode terminals, wherein a gap between the neighboring connection electrodes is formed so as to become a maximum near the end surface of the magnetic layer.

7. An electronic component according to claim 3, wherein a plurality of sets of electrode pads and connection electrodes are formed on a side surface that is opposite to the outer surface.

8. An electronic component according to claim 1, further comprising a coil conductor connected to the internal electrode terminal, and an external electrode having the electrode pad and the connection electrode.

* * * * *